(12) United States Patent
Kime et al.

(10) Patent No.: US 6,984,876 B2
(45) Date of Patent: Jan. 10, 2006

(54) SEMICONDUCTOR DEVICE FORMED HAVING A METAL LAYER FOR CONDUCTING THE DEVICE CURRENT AND FOR HIGH CONTRAST MARKING AND METHOD THEREOF

(75) Inventors: Kent Kime, Phoenix, AZ (US); Jeffrey Pearse, Chandler, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/854,465

(22) Filed: May 27, 2004

(65) Prior Publication Data
US 2005/0263859 A1    Dec. 1, 2005

(51) Int. Cl.
*H01L 23/552* (2006.01)
(52) U.S. Cl. ........................ 257/659; 256/678; 438/106
(58) Field of Classification Search ................ 257/659, 257/660, 678, 727; 438/106, 121
See application file for complete search history.

(56) References Cited

U.S. PATENT DOCUMENTS

| 5,268,065 | A  |   | 12/1993 | Grupen-Shemansky |
| 6,261,919 | B1 |   | 7/2001  | Omizo |
| 6,448,632 | B1 | * | 9/2002  | Takiar et al. ............... 257/659 |
| 2003/0003688 | A1 |   | 1/2003 | Tandy et al. |
| 2003/0157762 | A1 |   | 8/2003 | Peterson |
| 2003/0162368 | A1 |   | 8/2003 | Connell et al. |
| 2004/0072456 | A1 | * | 4/2004 | Dozier et al. ................. 439/83 |

* cited by examiner

*Primary Examiner*—Douglas W. Owens
(74) *Attorney, Agent, or Firm*—Kevin B. Jackson

(57) ABSTRACT

A power semiconductor device including a semiconductor die having electrically active first and second surfaces. A mark is located on the second surface configured to facilitate identification of the device and a metal layer is formed over the second surface of the semiconductor die and over the mark. The metal layer is configured to conduct a current of the device and to allow the mark to be visible for identification purposes.

23 Claims, 5 Drawing Sheets

US 6,984,876 B2

SEMICONDUCTOR DEVICE FORMED HAVING A METAL LAYER FOR CONDUCTING THE DEVICE CURRENT AND FOR HIGH CONTRAST MARKING AND METHOD THEREOF

BACKGROUND OF THE INVENTION

The present invention relates in general to semiconductor devices and, more particularly, to semiconductor devices having a substrate with opposite surfaces electrically active that is patterned and then coated with a metal to provide information pertaining to the semiconductor.

Electronics system manufacturers continue to demand lower cost integrated circuits and other semiconductor devices in order to reduce the cost of electronics systems. In response, many semiconductor manufacturers are providing unpackaged semiconductor dice or chips which can be mounted in a "flip-chip" fashion with a first die surface attached directly to system circuit boards. This approach reduces the direct cost of the semiconductor devices and also improves their performance by reducing lead inductance and other parasitic elements. However, the "flip-chip" technique often increases the indirect costs because such an unpackaged semiconductor chip reveals little or no information pertaining to the type of die such as its part number or manufacturer. In case of a system malfunction, it is difficult to trace a defect to a particular manufacturer or fabrication process.

To avoid this problem, some chips are fabricated with a die surface coating marked with information about the semiconductor device to facilitate tracing the device to its manufacturer in the event of a defect. However, this results in the information having a low contrast and therefore low visibility, in some cases even when viewed through a microscope or other visual tool. To compensate for the low contrast, the prior art coatings are marked with large fonts, which reduces the amount of information that can be provided, especially on a small die. As a result, the ability to trace a defective semiconductor device to a specific processing step is reduced, making it more difficult to prevent future defects that could enhance the die yield and reliability to reduce the overall fabrication cost of the device and system.

Furthermore, marking coatings on devices where both surfaces of the chip are electrically active and carry a current of the device such as power devices like field effect transistor (FET), diodes or insulated gate bipolar transistors (IGBT) damages the coating which decreases device performance and can even cause device failure. Furthermore, marking reduces the planarity of the coating which makes difficult effective attachment of heat sinks or other heat removal structures.

Hence, there is a need for a semiconductor device having a coating that conducts a current of the device and method of providing easily discernible information pertaining to the semiconductor device in order to reduce the fabrication cost and increase the reliability and performance of the semiconductor device.

DETAILED DESCRIPTION OF THE DRAWINGS

In the figures, elements having the same reference number have similar functionality.

Figure 1:
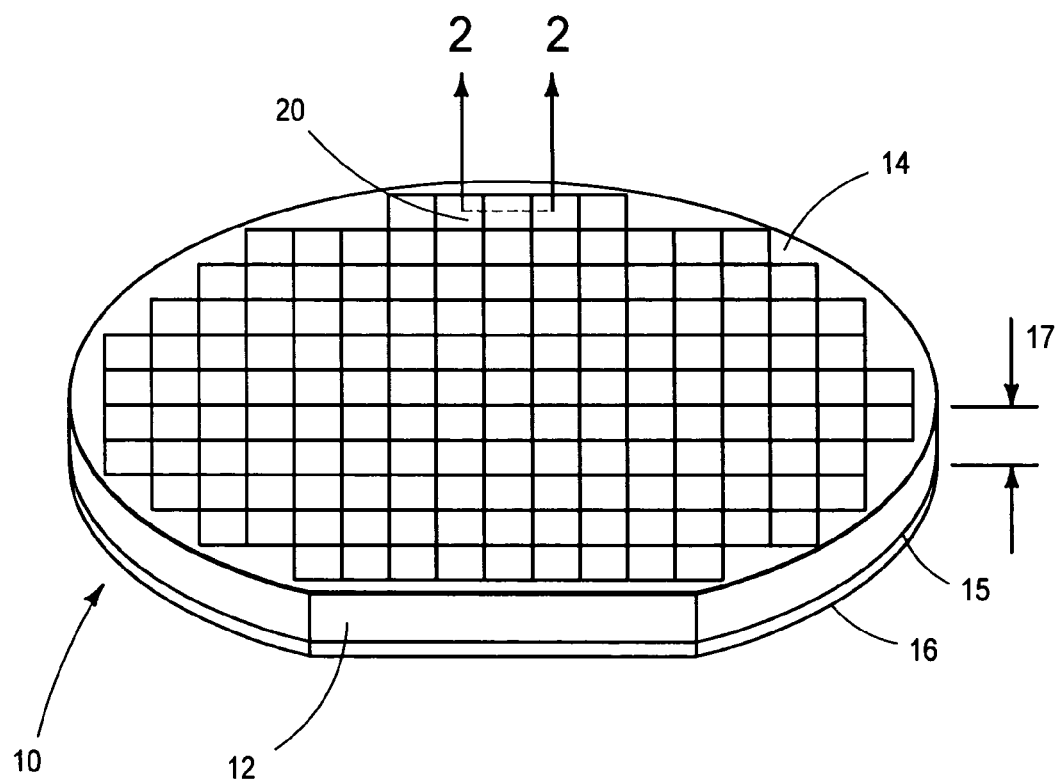
FIG. 1 is an isometric view of a semiconductor wafer.

FIG. 1 is an isometric view of a semiconductor wafer 10 fabricated to have a plurality of semiconductor dice, one of which is designated as semiconductor substrate or die 20. In one embodiment, substrate 20 includes silicon material having a thickness 17 between about seventy five and four-hundred micrometers. In an alternate embodiment, substrate 20 includes silicon germanium material. A wafer flat 12 provides information as to the crystallographic orientation of wafer 10. A first electrically active or topside surface 14 is used to form semiconductor device or chip 20 that may include transistors and/or other active devices. Semiconductor device 20 has a second electrically active or backside surface 15. Electrically active backside surface 15 conducts a current $I_{BS}$ of the semiconductor device. In one embodiment, semiconductor device 20 includes a power semiconductor device 20 such as a field effect transistor (FET), diode, insulated gate bipolar transistor (IGBT) or other power device requiring the backside 15 and the topside 14 of the die 20 to be electrically active. As well known in the art, backside 15 differs from topside 14 in that if substrate 20 is to be thinned, substrate material is removed from the backside 15 using common thinning or "back grind" process such as but not limited to grinding, etching or lapping and the like. Such substrate material removal or thinning is commonly performed to remove backside defects induced from wafer handling during processing, to thin the wafer or prior to backside metal formation.

Figure 2:
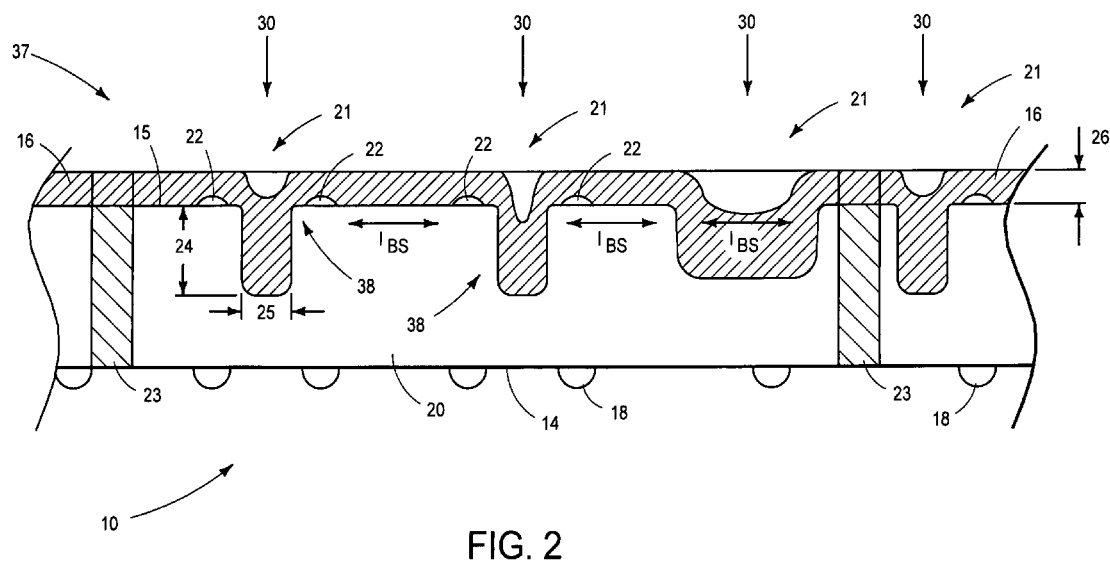
FIG. 2 is a cross-sectional view showing further detail of a portion of the wafer.

FIG. 2 is a cross-sectional view showing a portion of wafer 10 including semiconductor die 20 in further detail. Note that semiconductor die 20 is shown in a "flip-chip" orientation which is reversed from the orientation of FIG. 1.

Prior to forming metal layer 16 over backside surface 15, information is marked on backside surface 15 by directing a ray 30 of electromagnetic radiation to selectively remove material from backside surface 15 of substrate 20 to form mark 21. In one embodiment, ray 30 comprises a laser beam which is programmed to produce mark 21 in the shape of alphanumeric characters or other symbols that represent the desired information. Parameters such as the current level of the laser device or beam intensity, pulse rate, beam diameter and scan time of the laser beam can be adjusted if desired to ensure that material from backside surface 15 is removed while producing minimal slag 22 on backside surface 15 of semiconductor die 20. Slag 22 is removed material redeposited on the backside surface during mark 21 formation. Slag 22 may have a height of about three micrometers over backside surface 15. Mark 21 is typically formed to a depth 24 of about five micrometers, and a width 25 of about forty micrometers.

It is important to note that marking requires a significant area 37 and amount or volume of material to be removed to establish a legible mark. Thus, as semiconductor die sizes and thickness are expected to shrink moving into the future, the area 37 and volume of the mark is also expected to increase as a percentage of available die area and volume. For example, a die having a two by two ball grid array with a 0.8 millimeter pitch has an available marking area or size of 1.6 millimeter by 1.6 millimeters. Thus, the amount of area used when providing nine mark (a typical number) each of about 0.42 millimeters high by 0.23 millimeters wide utilizes about 0.87 square millimeters across the backside surface, or about thirty-six percent (100*0.87/2.56) of the backside surface. Similarly, future reductions in die thickness will exacerbate the problem of mark volume consuming more and more of the available substrate volume.

Unfortunately, as electrically active backside 15 conducts a current $I_{BS}$ of the device 20, increasing mark area and/or mark volume will increase silicon lattice disruption causing decreased current carrying ability and localized hotspots from the current collecting at the edges 38 of the mark. Thus, as customers require increased current carrying ability and improved thermal performance while also requiring thinner and smaller die, it would be highly desirable to solve the problems introduced by increasing mark area and volume. In one embodiment, the semiconductor die 20 includes a power FET having a lateral or drain current ($I_{BS}$) greater than about 0.5 amperes.

Although shown as generally rectangular in shape, material removal, that is marking to produce mark 21, may produce mark 21 shapes of various geometries such as channel or trenches, straight or curved.

In an alternate embodiment, mark 21 may be formed by applying a photoresist layer (not shown) to backside surface 15 and selectively etching using commonly available wet or dry etching techniques to remove material.

Mark 21 may be used for a variety of purposes. For example, the mark may identify the type of semiconductor device upon which the mark is formed. The mark can also be placed in a certain location, in a specific corner for example, so that the orientation of the device may be determined. One reason the orientation of the device is important is so that the device may be properly positioned and connected to a printed circuit board. Alignment between topside surface 14 and backside surface 15, e.g., between marks 21 and semiconductor die 20, is achieved with a standard alignment tool.

A metal layer 16 is applied to backside surface 15 for conducting the current IBS of device 20. In one embodiment, metal layer 16 includes solderable back metal formed to a thickness in the range of about fifteen thousand angstroms to about twenty thousand angstroms. Examples of solderable back metal 16 include metal or metal alloys containing titanium, nickel, silver, chrome, gold, nickel silicide, or nickel vanadium selected for proper solderability, adhesion and mechanical strength. An example of metal layer 16 that is not considered solderable back metal due to poor solderability is aluminum. Backside metal 16 must also be selected of greater thickness 26 and to have material properties to optimally cover and seal the slag 22 produced by the mark, as well carry the current $I_{BS}$ of the device over and from those areas damaged by the mark without undesirably limiting the current or inducing increased localized thermal deviations or "hotspotting". Thus thicker backside metal 16 reduces current resistance as well as generally improving the thermal performance of device 20. Additionally, as thin backside metal on devices having both sides electrically active would provide poor coverage of slag 22 and mark 21 damaged areas as well as poor detection and legibility of the mark, such backmetal 16 must also be sufficiently thick such that the mark may be identified on the surface. This unexpected increase in metal 16 thickness required to improve legibility is thought to be unique to devices having both sides electrically active, and appears to enhance legibility rather than decrease legibility as one might expect. Additionally, as the thickness of metal 16 is increased, legibility appears to be further enhanced as die thickness is decreased below four-hundred micrometers.

The metal layer 16 may be applied by using the well known process of sputtering. Sputtering coats a surface with a metal by depositing the metal at an atomic level. Other processes for applying metal layer 16 include vapor deposition and chemical plating.

A plurality of conductive bumps 18 are formed on topside surface 14 for making electrical and mechanical connections between circuitry on topside surface 14 and a system circuit board 60, package leadframe (not shown) or another die such as in the case of stacked die (not shown). Conductive bumps 18 typically are formed with a low temperature solder, plated copper or another conductive material suitable for making the necessary electrical and/or mechanical attachments without degrading the performance of circuitry formed on semiconductor die 20.

Semiconductor die 20 is bounded by a saw street 23 which is used to singulate semiconductor die 20 from semiconductor wafer 10 after metal layer 16 is formed. Singulation can occur prior to or after forming conductive bumps 18.

Figure 3:
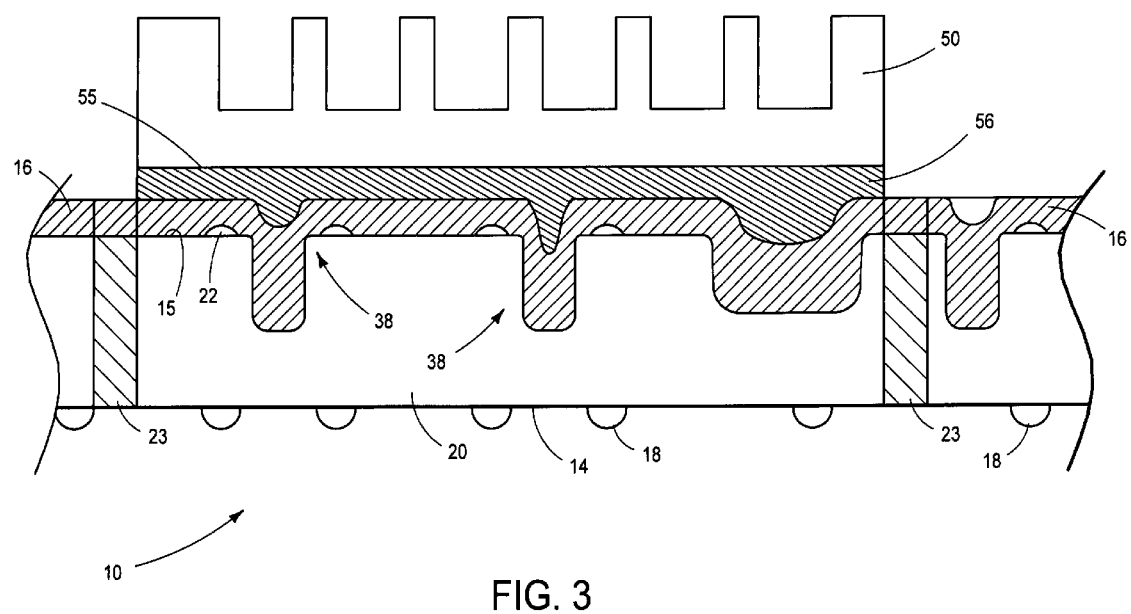
FIG. 3 is a cross-sectional view showing a heat sink attached to the portion of the wafer.

FIG. 3 shows a heat sink 50 mounted to the backmetal layer 16. Heat sink mounting is accomplished by a variety of attachment material 56, including but not limited to epoxy attach, thermal conductive paste, solder or other. It is important that heatsink 50 attachment area 55 be planar as possible while still providing mark 21 legibility in order to provide optimum heat sink 50 mechanical attachment and thermal conduction. Thus, using greater thickness 26 of metal 16 improves planarity as mark 21 is smoothed by thicker metal 16. Additionally, as above thicker metal 16 also increases legibility of the mark while improving the current IBS conduction of device 20.

Figure 4:
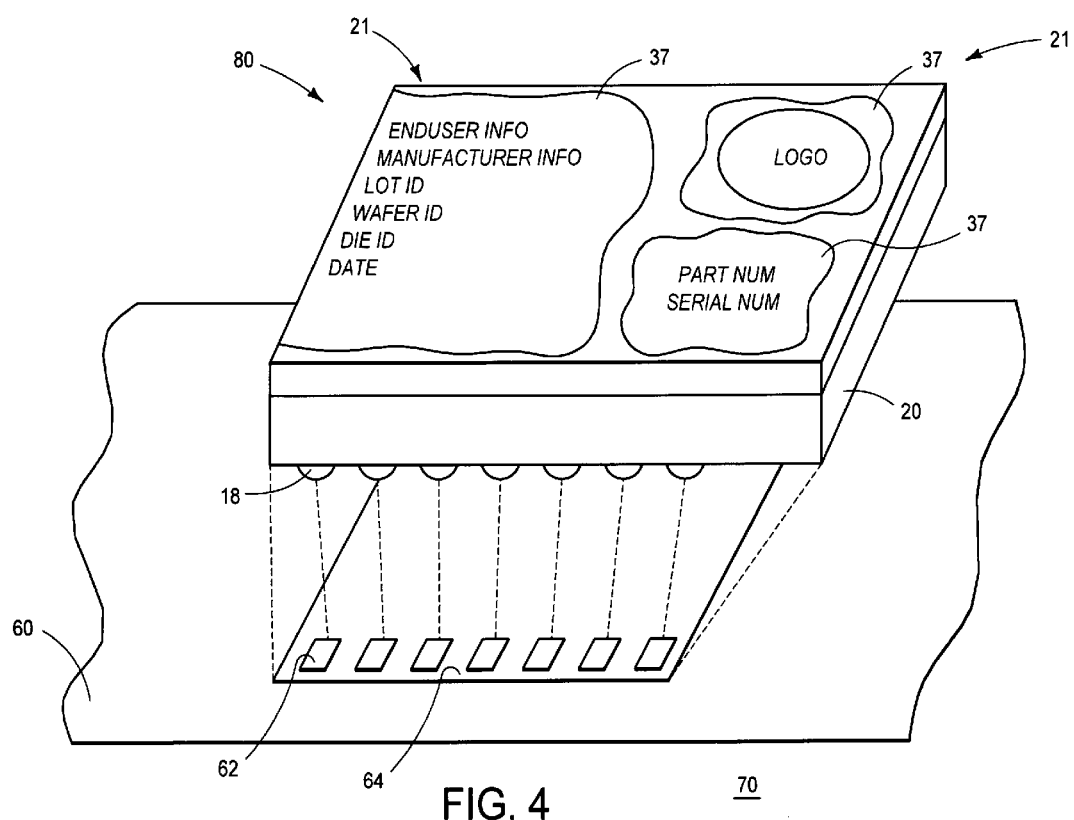
FIG. 4 is an exploded view of an electrical system including a semiconductor device formed with a packaged semiconductor die singulated from the semiconductor wafer.

FIG. 4 shows an exploded view of an electrical system 70 including a system circuit board 60 and a packaged semiconductor device 80 formed with semiconductor die 20. Circuit board 60 includes a mounting region 64 for mounting conductive bumps 18 of packaged semiconductor device 80 to a plurality of conductive bonding pads 62.

Information pertaining to packaged semiconductor device 80 is provided as described above by selectively removing material from substrate 20 and coating with metal layer 16, thereby providing viewable symbols and/or alphanumeric characters 21 in sharp contrast. The alphanumeric characters 21 shown in packaged semiconductor device 80 are formed with a height of about two hundred fifty micrometers.

Examples of this information include the end user's or system manufacturer's identity or custom part number to reduce the inventory or other cost of semiconductor device 80. The semiconductor manufacturer's logo or other identification can be provided to facilitate communication in the event a defect is discovered in packaged semiconductor device 80. Wafer and die processing information such as lot, wafer and die identification as well as part numbers and/or serial numbers allow a semiconductor manufacturer to trace packaged semiconductor device 80 to specific processing steps in order to localize the source of a defect. Many defects can be associated with a particular processing step and often can be corrected by modifying the processing step, thereby improving the reliability of similarly processed devices and reducing the overall fabrication cost of the devices. In addition, information useful to an end user or system manufacturer, such as the die orientation and/or location of a reference lead, i.e., pin "1", can be provided as well. In addition to alphanumeric characters, the enhanced contrast provided by the above described structures is also suitable for providing information in the form of machine readable symbols or bar codes.

Figure 5:
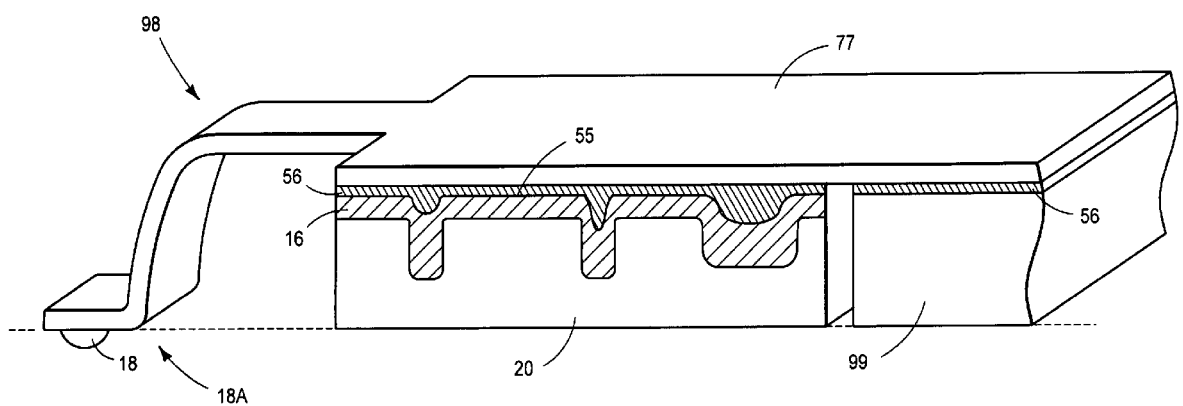
FIG. 5 is a cross sectional view showing a clip attached to the portion of the wafer.

FIG. 5 shows a metal piece or clip 77 mounted to backmetal layer 16 of semiconductor die 20 rather than heatsink 50. Metal piece or clip 77 is typically fairly rectangular pieces of electrically conductive metal such as copper or tin plated copper, either formed by stamping or etching, used to form an electrical attachment from semiconductor die 20 to another semiconductor die 99, or as a lead 98 for electrical and mechanical connection to a circuit board, leadframe, another die, or the like. Although lead 98 is shown formed with external surface 18a in a plane with the bottom of die 20, other configurations and orientations may be provided. Lead 98 may further include a conductive bump 18 on its external surface 18A. Clip 77 mounting is accomplished by a variety of attachment material 56, including but not limited to epoxy attach, thermal conductive paste, solder or other. It is important that clip 77 attachment area 55 be planar as possible while still providing mark 21 legibility in order to provide optimum clip 77 mechanical attachment and electrical connection. Thus, using greater thickness 26 of metal 16 improves planarity as marks 21 are smoothed by thicker metal 16. Importantly, the improved planarity of metal 16 reduces clip 77 rotation and movement during the clip 77 attachment process, which reduces connection defects normally associated with large mark 21 area and volume.

In summary, a semiconductor device and method of providing information about the semiconductor device is described. The semiconductor device includes a semiconductor die having electrically active first and second surfaces. A mark is located on the second surface configured to facilitate identification of the device and a metal layer is formed over the second surface of the semiconductor die and over the mark. The metal layer is configured to conduct a current of the device and to allow the mark to be visible for identification purposes.

What is claimed is:

1. A power semiconductor device, comprising:
    a semiconductor die having a first surface and a second surface,
        wherein the first and second surface are electrically active;
    a mark located on the second surface, the mark configured to facilitate the identification of the device;
    a metal layer formed over the second surface of the semiconductor die and over the mark, the metal layer configured to conduct a current of the device and to allow the mark to be visible for identification purposes; and
    a clip attached to the second surface of the semiconductor die for making an external electrical and mechanical connection.

2. The power semiconductor device of claim 1, wherein a thickness of the semiconductor die is between about seventy-five and four-hundred micrometers.

3. The power semiconductor device of claim 1, wherein the mark covers greater than about thirty-five percent of the second surface of the semiconductor die.

4. The power semiconductor device of claim 2, wherein the metal layer is formed having a thickness greater than about fifteen thousand angstroms.

5. The power semiconductor device of claim 4, wherein the metal layer is formed with a solderable back metal selected from the group consisting of nickel, silver, gold, nickel silicide, and nickel vanadium.

6. The power semiconductor device of claim 1, wherein the current is greater than about 0.5 amperes.

7. The power semiconductor device of claim 1, further comprising a conductive bump formed on the first surface of the semiconductor die for making an external electrical and mechanical connection.

8. The power semiconductor device of claim 1, wherein the clip is formed of etched copper.

9. The power semiconductor device of claim 1, further comprising a conductive bump formed on an external surface of the clip for making an external electrical and mechanical connection.

10. A semiconductor device, comprising;
    a semiconductor substrate having a first surface,
        wherein the first surface is electrically active to carry a current of the semiconductor device;
    a mark located on the first surface, the mark configured to facilitate the identification of the device; and
    a metal layer formed over the first surface of the semiconductor substrate and over the mark, the metal layer configured to conduct the current of the device and to allow the mark to be visible for identification purposes, wherein the metal layer is formed having a thickness greater than about fifteen thousand angstroms.

11. The semiconductor device of claim 10, wherein a thickness of the semiconductor substrate is between about seventy-five and four-hundred micrometers.

12. The semiconductor device of claim 11 further comprising a clip for making an external electrical and mechanical connection attached to the metal layer.

13. The semiconductor device of claim 10, wherein the metal layer is formed with a solderable back metal selected from the group consisting of nickel, silver, gold, nickel silicide, and nickel vanadium.

14. The semiconductor device of claim 10, wherein the current is greater than about 0.5 amperes.

15. The semiconductor device of claim 10, wherein the information includes an alphanumeric character having a height along the first surface less than about three hundred micrometers.

16. The semiconductor device of claim 10, wherein the semiconductor substrate has a second surface opposite the first surface and formed having a conductive bump for making an external electrical and mechanical connection.

17. The semiconductor device of claim 12, wherein the clip is formed of etched copper.

18. The semiconductor device of claim 17, further comprising a conductive bump formed on an external surface of the clip for making the external electrical and mechanical connection.

19. A packaged semiconductor device, comprising;
    a semiconductor chip having a first surface,
        wherein the first surface is electrically active to carry a current of the semiconductor device;
    a mark located on the first surface, the mark configured to facilitate the identification of the device; and
    a solderable metal layer formed over the first surface of the semiconductor chip and over the mark, the solderable metal layer configured to conduct the current of the device and to allow the mark to be visible for identification purposes, wherein the solderable metal layer is formed having a thickness greater than about fifteen thousand angstroms, and wherein the solderable metal layer includes one of nickel, nickel vanadium, silver, or gold.

20. A method of making a semiconductor device, comprising the steps of:

providing a semiconductor substrate having a first electrically active surface for conducting a current of the semiconductor device;

removing substrate material to form a mark on the first electrically active surface, the mark configured to facilitate the identification of the device; and forming a metal layer over the first electrically active surface of the semiconductor substrate and over the mark, the metal layer configured to conduct the current of the device and to allow the mark to be visible for identification purposes, wherein the metal layer has a thickness greater than about fifteen thousand angstroms.

21. The method of claim 20, further comprising the step of attaching a conductive clip to the first electrically active surface for making an external electrical and mechanical connection.

22. The method of claim 20, wherein the step of removing includes the step of forming an alphanumeric character with a font height along the first surface less than about three hundred micrometers in the substrate material.

23. The method of claim 20, wherein the step of forming includes the step of forming a solderable metal layer comprising one of nickel, nickel vanadium, silver, or gold.

* * * * *